United States Patent
Mataya et al.

(10) Patent No.: US 9,338,927 B2
(45) Date of Patent: May 10, 2016

(54) THERMAL INTERFACE MATERIAL PAD AND METHOD OF FORMING THE SAME

(71) Applicant: Western Digital Technologies, Inc., Irvine, CA (US)

(72) Inventors: Richard A. Mataya, Rancho Santa Margarita, CA (US); Nader M. Salessi, Laguna Niguel, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 280 days.

(21) Appl. No.: 13/913,068

(22) Filed: Jun. 7, 2013

(65) Prior Publication Data

US 2014/0328024 A1  Nov. 6, 2014

Related U.S. Application Data

(60) Provisional application No. 61/818,756, filed on May 2, 2013.

(51) Int. Cl.
*H05K 7/20* (2006.01)

(52) U.S. Cl.
CPC ........ *H05K 7/20481* (2013.01); *H05K 7/20454* (2013.01); *Y10T 29/49366* (2015.01)

(58) Field of Classification Search
CPC ... F28F 3/08; H05K 7/20454; H05K 7/20481; Y10T 29/49366
USPC ........ 361/679.46–679.54, 688–723; 165/185; 29/890.039
See application file for complete search history.

(56) References Cited

U.S. PATENT DOCUMENTS

| | | |
|---|---|---|
| 6,856,556 B1 | 2/2005 | Hajeck |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |

(Continued)

OTHER PUBLICATIONS

International Search Report and Written Opinion dated Sep. 16, 2014 from related PCT Serial No. PCT/US2014/036455, 10 pages.

*Primary Examiner* — Anthony Haughton
*Assistant Examiner* — Yahya Ahmad
(74) *Attorney, Agent, or Firm* — Shumaker & Sieffert, P.A.

(57) ABSTRACT

A thermal interface material (TIM) pad is disclosed for dissipating heat from a component. The TIM pad includes a plurality of thermal interface material layers and at least one graphene layer interposed between the plurality of TIM layers. A method for forming the TIM pad includes stacking the plurality of TIM layers with at least one graphene layer interposed between the plurality of TIM layers to reach a length for the TIM pad. The stacked layers are cut corresponding to a thickness for the TIM pad for compression against the component.

24 Claims, 4 Drawing Sheets

(56) References Cited

U.S. PATENT DOCUMENTS

| | | |
|---|---|---|
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,247,806 B2 | 8/2012 | Chae et al. |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2005/0062154 A1* | 3/2005 | Duchesne .......... H01L 23/3737 257/738 |
| 2006/0063018 A1* | 3/2006 | Krassowski .......... H01L 23/373 428/545 |
| 2008/0128122 A1* | 6/2008 | Huang .................... F28D 20/02 165/185 |
| 2008/0202386 A1* | 8/2008 | Hougham .............. B82Y 30/00 106/472 |
| 2010/0085713 A1 | 4/2010 | Balandin et al. |
| 2010/0174849 A1 | 7/2010 | Walston et al. |
| 2010/0250793 A1 | 9/2010 | Syu |
| 2010/0299918 A1* | 12/2010 | Oda .................... H01L 23/3675 29/841 |
| 2011/0099323 A1 | 4/2011 | Syu |
| 2011/0283049 A1 | 11/2011 | Kang et al. |
| 2012/0070612 A1* | 3/2012 | Lee ......................... B32B 9/007 428/141 |
| 2012/0128983 A1 | 5/2012 | Yoon et al. |
| 2012/0206882 A1 | 8/2012 | Mohammed et al. |
| 2012/0234524 A1* | 9/2012 | Fan ........................ B32B 15/04 165/185 |
| 2012/0241069 A1 | 9/2012 | Hofmann et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0160673 A1* | 6/2014 | Sauciuc ................... H01L 23/36 361/679.54 |
| 2014/0181432 A1 | 6/2014 | Horn |
| 2014/0223255 A1 | 8/2014 | Lu et al. |
| 2014/0224466 A1* | 8/2014 | Lin ........................ B82Y 30/00 165/185 |
| 2014/0248430 A1* | 9/2014 | Wong .................. C01B 31/0484 427/289 |

\* cited by examiner

THERMAL INTERFACE MATERIAL PAD AND METHOD OF FORMING THE SAME

CROSS-REFERENCE TO RELATED APPLICATIONS

This application claims the benefit of U.S. Provisional Application No. 61/818,756, filed on May 2, 2013, which is hereby incorporated by reference in its entirety.

BACKGROUND

Thermal interface material (TIM) is often used in electronics between components to increase thermal transfer efficiency between the components. TIM is also known as a gap pad since it can flexibly fill surface imperfections on the components. Such surface imperfections would otherwise hinder heat transfer between the components since air is a poor conductor of heat with a thermal conductivity of 0.024 W/mK.

Although TIMs can typically achieve a thermal conductivity of approximately 1 to 5 W/mK, this thermal conductivity is still much lower than the thermal conductivity for other less flexible, but thermally conductive materials such as aluminum.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Figure 1A:
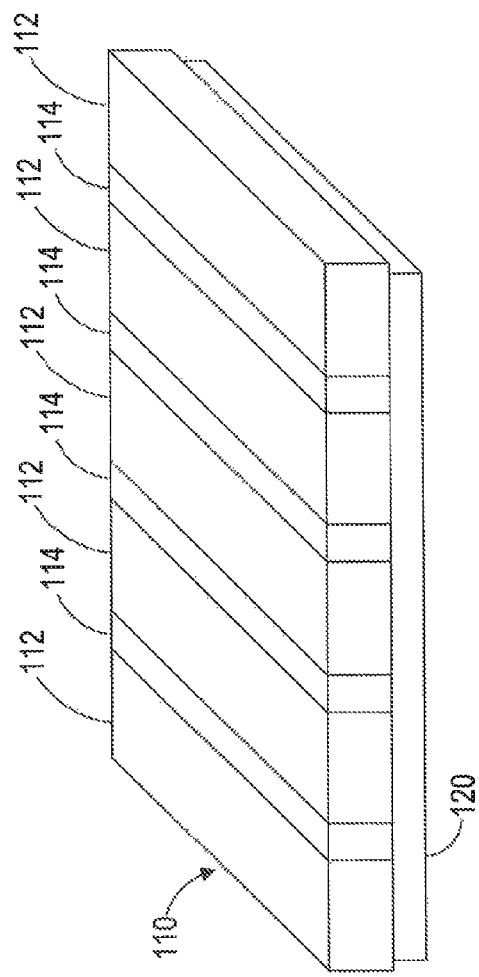
FIG. 1A is a top perspective view of a thermal interface material (TIM) pad on a component according to an embodiment.
Figure 1B:
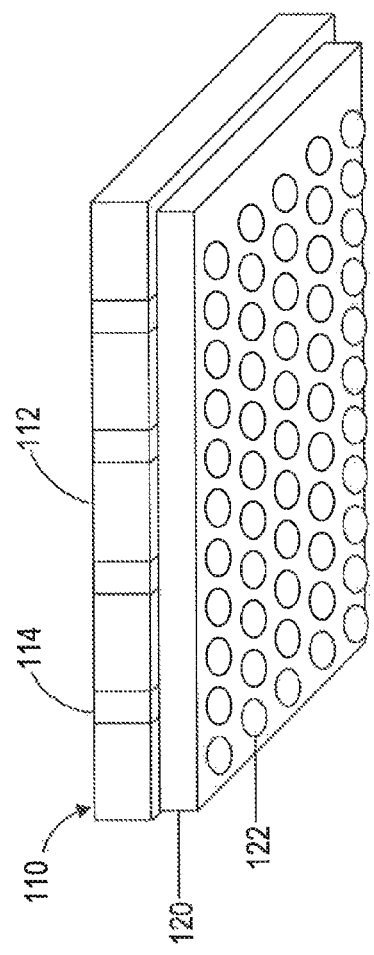
FIG. 1B is a bottom perspective view of the TIM pad and component of FIG. 1A.

FIGS. 1A and 1B show top and bottom perspective views of thermal interface material (TIM) pad 110 on component 120. As will be appreciated by those of ordinary skill in the art, FIGS. 1A and 1B are not necessarily drawn to scale.

In the example of FIGS. 1A and 1B, component 120 is a system on a chip (SOC) which generates heat during operation and TIM pad 110 is arranged to dissipate heat from component 120. As shown in FIG. 1A, TIM pad 110 includes TIM material layers 112 and graphene layers 114 interposed or striped between TIM layers 112. In other embodiments, component 120 may be another type of electronic component that generates heat during operation.

TIM layers 112 can include any flexible TIM or combination of materials known in the art for conducting heat and filling surface imperfections on components. In this regard, TIM layers 112 may also include an adhesive property allowing them to adhere to a surface. Examples of such flexible TIMs can include certain metal, carbon, or ceramic particles suspended in a silicone based medium. In one example, TIM layers 112 can have a thermal conductivity of 1 to 5 W/mK.

Graphene layers 114 can include one or more sheets of graphene (i.e., graphite sheets) extending in a direction substantially perpendicular to the top surface of component 120. In such a configuration, graphene layers 114 can have a thermal conductivity of approximately 1500 W/mK in a direction substantially perpendicular to the top surface of component 120 and a thermal conductivity of approximately 25 W/mk in a direction substantially parallel to the top surface of component 120. As a result, the thermal conductivity of TIM pad 110 is greater in a direction substantially perpendicular to the top surface of component 120 than in a direction substantially parallel to the top surface of component 120.

Due to the high thermal conductivity of graphene layers 114, it is ordinarily possible to significantly increase the thermal conductivity of TIM pad 110 by adding graphene layers 114 while still allowing for the compressibility and air gap filling capabilities of TIM layers 112.

As will be understood by those of ordinary skill in the art, other embodiments can include different quantities of TIM layers 112 and graphene layers 114 from those shown in FIGS. 1A and 1B without departing from the spirit and the scope of the present disclosure.

In some embodiments, graphene layers 114 can form between 5% and 15% of the total volume of TIM pad 110. In one such embodiment, a volume of TIM pad 110 is comprised of 90.9% TIM layers 112 and 9.1% of graphene layers 114 where TIM layers 112 have a thermal conductivity of 5 W/mK and graphene layers 114 have a thermal conductivity of 1500 W/mK in a direction substantially perpendicular to the top surface of component 120. In this example, the total thermal conductivity of TIM pad 110 in the substantially perpendicular direction is increased from 5 W/mK to approximately 141 W/mK by interposing graphene layers 114 between TIM layers 112. This is shown by adding the thermal conductivities of TIM layers 112 and graphene layers 114 with respect to their proportional volumes in TIM pad 110. That is, the total thermal conductivity for TIM pad 110 in the above example can be calculated as:

Total Thermal Conductivity=(90.9%×5 W/mK)+(9.1%× 1500 W/mK), which is approximately equal to 141 W/mK.

FIG. 1B shows a bottom perspective view of component 120 and TIM pad 110. As shown in FIG. 1B, numerous solder balls 122 are attached to the bottom surface of component 120. Balls 122 can be part of a ball grid array (BGA) for mounting component 120 on a printed circuit board (PCB). It will be understood by those of ordinary skill in the art that the quantities of balls in FIG. 1B are used for illustrative purposes and that actual quantities of balls 122 may differ.

Figure 2:
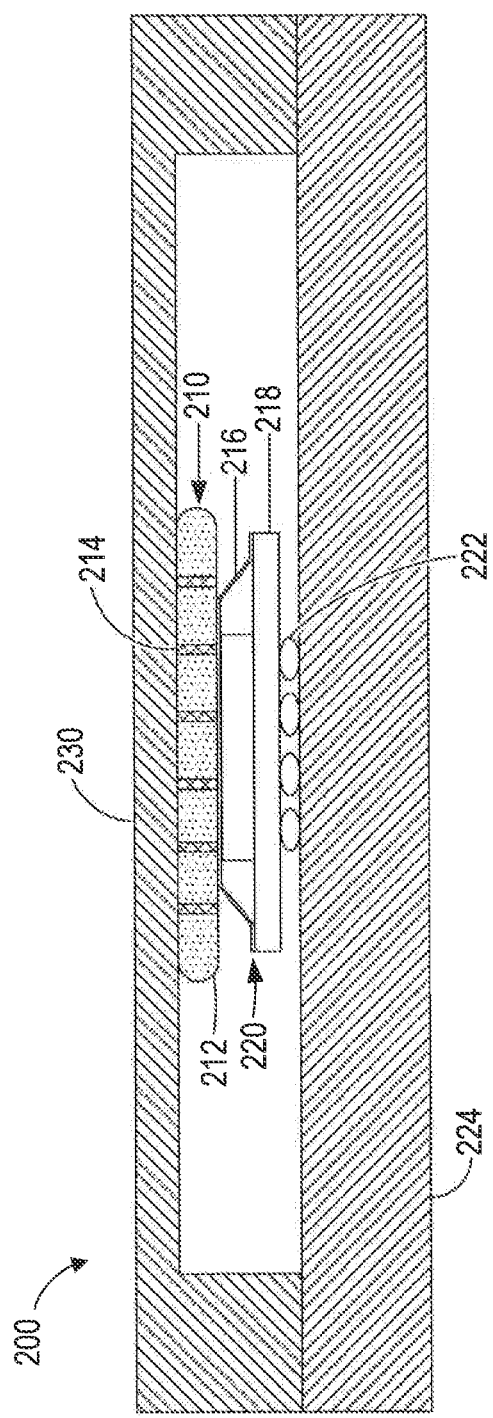
FIG. 2 is a cross-section view of a TIM pad compressed between a frame and a component according to an embodiment.

FIG. 2 provides a cross-section view of device 200 which can be, for example, a data storage device. As shown in FIG.

2, device 200 includes frame 230 and PCB 224. Frame 230 can be comprised of a thermally conductive material to dissipate heat from device 200. Such a frame material can include, for example, an aluminum alloy such as 6061-T6 with a thermal conductivity of 167 W/mK.

Component 220 is mounted on PCB 224 through solder balls 222 which can allow for thermal and/or electrical conduction between component 220 and vias (not shown) in PCB 224. Component 220 can include a heat generating component such as, for example, an SOC, a flash memory or a double data rate synchronous dynamic random-access memory (DDR SDRAM).

In FIG. 2, component 220 includes substrate 218 and grounded heat spreader plate 216 as an exterior layer of component 220. Heat spreader plate 216 is grounded and covers substrate 218 to reduce a likelihood of contact between graphene layers 214 and substrate 218 since graphene is electrically conductive.

As shown in FIG. 2, TIM pad 210 is compressed between frame 230 and component 220. In the example of FIG. 2, the outer layers of TIM pad 210 shown on the left and right sides of TIM pad 210 include TIM layers 212 to allow for outward deformation of TIM pad 210. In this regard, a bottom surface of TIM pad 210 can have approximately the same area in an uncompressed state as a top surface of component 220 for contacting TIM pad 210. When compressed against component 220, TIM pad 210 can extend beyond an edge of the contact surface of component 220. Such an overlap is shown in FIG. 2 and can allow for additional heat spreading in a direction parallel to TIM pad 210.

In FIG. 2, TIM pad 210 includes graphene layers 214 interposed or striped between TIM layers 212. TIM layers 212 are compressible to fill surface imperfections on frame 230 and component 220 that would otherwise form air gaps with a less compressible material. Although graphene is generally not very flexible, graphene layers 214 are sufficiently thin to still allow for compression of TIM pad 210. In one embodiment, graphene layers 214 can be approximately 0.1 mm thick (i.e., between 0.08 mm and 0.12 mm thick).

Graphene layers 214 include at least one sheet of graphene arranged in a direction substantially perpendicular to component 220. The high thermal conductivity of graphene layers 214 in this direction ordinarily improves thermal transfer between component 220 and frame 230 to allow for more dissipation of heat from device 200 through frame 230.

Figure 3C:
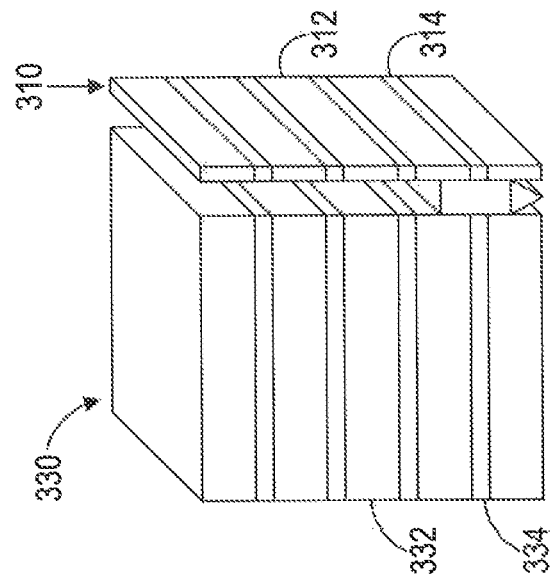
FIG. 3C illustrates further cutting of the stack of FIG. 3B to form a TIM pad according to an embodiment.
Figure 3B:
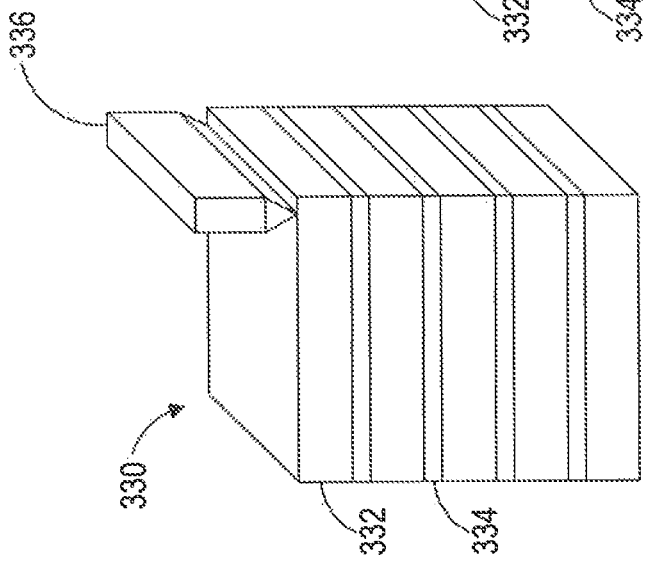
FIG. 3B illustrates cutting of the stack of FIG. 3A according to an embodiment.
Figure 3A:
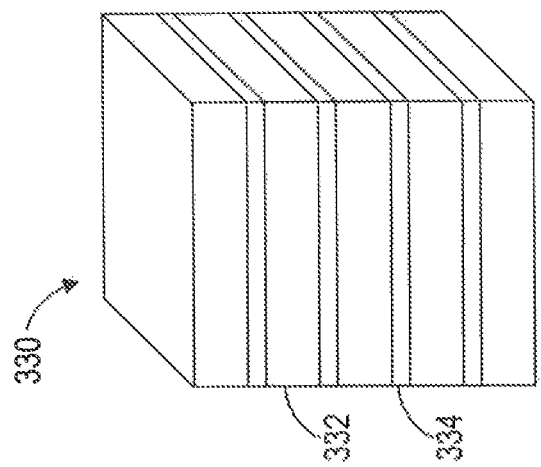
FIG. 3A illustrates a stack of TIM layers with graphene layers interposed between the TIM layers according to an embodiment.

FIGS. 3A to 3C illustrate formation of TIM pad 310 according to an embodiment. In FIG. 3A, TIM layers 332 are stacked with graphene layers 334 interposed or striped between TIM layers 332 to form stacked layers 330. In this regard, TIM layers 332 may include an adhesive property that allows TIM layers 332 to adhere to graphene layers 334. Graphene layers 334 are stacked so that graphene layers 334 have a higher thermal conductivity in a direction parallel to TIM layers 332 (i.e., the horizontal direction in FIG. 3A).

In one example, TIM layers 332 may be approximately 1 mm thick (i.e., between 0.08 mm and 1.20 mm thick) and graphene layers 334 may be approximately 0.1 mm thick (i.e., between 0.08 mm and 1.20 mm thick). The overall height of stacked layers 330 can correspond to a length for TIM pad 310 which is shown in FIG. 3C. In one embodiment, graphene layers 334 form approximately 9% of the total volume of stacked layers 330.

In FIG. 3B, stacked layers 330 are cut with cutter 336 corresponding to a thickness for TIM pad 310. Cutter 336 can include any bifurcating tool for achieving a particular tolerance for a specified thickness of TIM pad 310. For example, cutter 336 may include a laser cutter for achieving a relatively small tolerance for a specified thickness or cutter 336 may include a saw or razor for a larger tolerance.

The thickness for TIM pad 310 can be slightly thicker than a space to be filled by TIM pad 310. This allows for compression of TIM pad 310 which typically improves thermal efficiency of TIM pad 310 by filling air gaps along a component and/or frame surface. In one example, TIM pad 310 is cut to a thickness of approximately 1 mm.

In FIG. 3C, TIM pad 310 is formed with the completion of cutting through stacked layers 330. As shown in FIG. 3O, resulting TIM pad 310 includes TIM layers 312 and graphene layers 314.

Although FIGS. 3A to 3C depict the formation of TIM pad 310 with TIM layers 312 and graphene layers 314 stacked vertically, other embodiments may orientate these layers and cutter 336 differently (e.g., horizontally instead of vertically).

Figure 4:
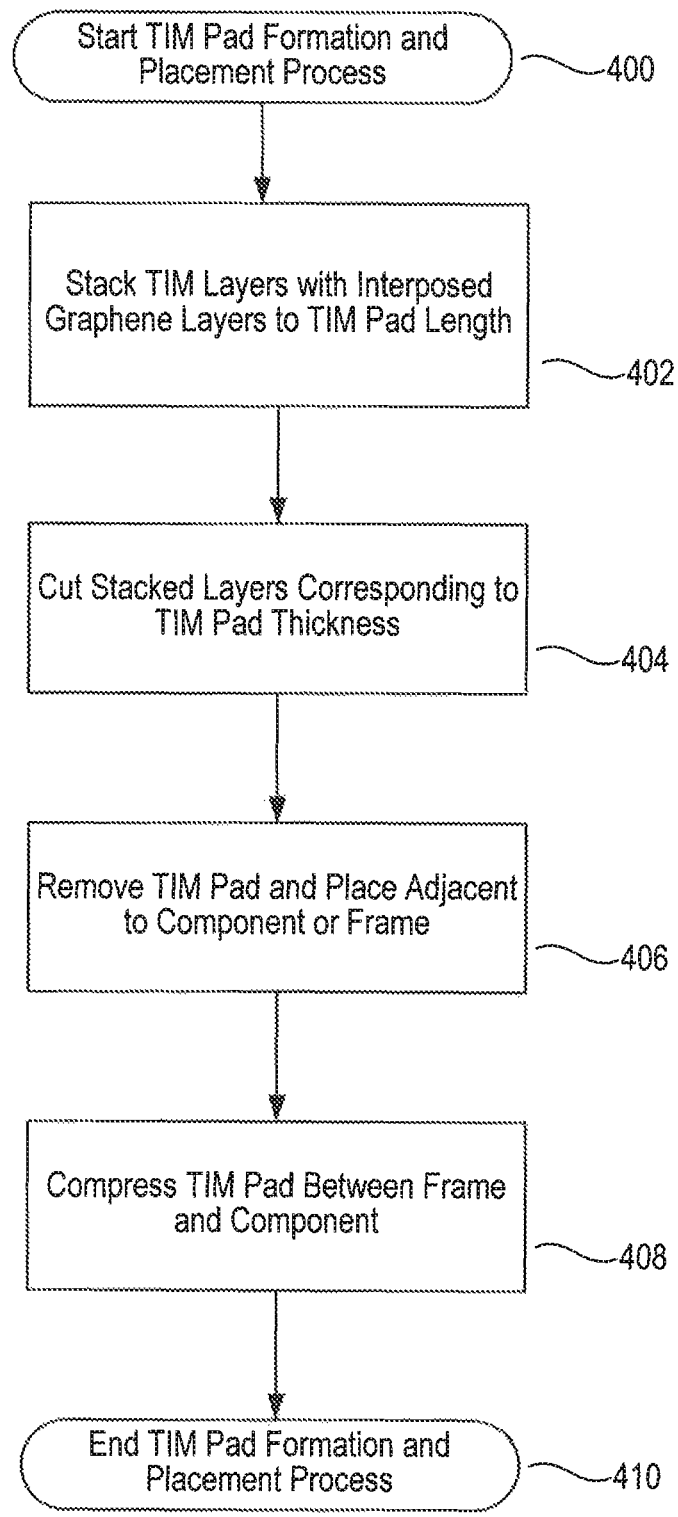
FIG. 4 is a flowchart for the formation and placement of a TIM pad according to an embodiment.

FIG. 4 is a flowchart for the formation and placement of a TIM pad according to an embodiment. The process begins in block 400 and TIM layers are stacked with interposed graphene layers to reach a desired TIM pad length in block 402. In one embodiment, the graphene layers may form between 5% and 15% of the total volume of the stacked layers. As noted above, the TIM layers may include an adhesive property which allows the TIM layers to adhere to the graphene layers. In addition, the desired length for the TIM pad may allow for an overlap of the TIM pad over a particular component (e.g., component 220 in FIG. 2) when compressed against the component.

In block 404, the stacked layers are cut at a thickness corresponding to a desired thickness and compression for the TIM pad. Specifically, the TIM pad can be cut to fill a particular space between a component and a frame (e.g., between component 220 and frame 230 in FIG. 2) with a certain amount of compression of the TIM pad. The compression of the TIM pad ordinarily improves thermal efficiency of the TIM pad by filling air gaps along a frame and/or component surface.

In block 406, the TIM pad is removed after cutting it from the stacked layers. A removable backing may optionally be applied to the TIM pad after removal to reduce contact with the TIM pad during handling or packaging.

After removal from the stacked layers, the TIM pad is placed adjacent (e.g., on top of) a component such as component 220 in FIG. 2 or is placed adjacent a frame such as frame 230 in FIG. 2. Any backing previously applied to the TIM pad may be removed as part of the placement of the TIM pad adjacent the component or the frame.

The TIM pad can be placed adjacent the component or frame such that the graphene layers extend in a direction substantially perpendicular to a contact surface of the component. This ordinarily allows for the thermal conductivity of the TIM pad to be increased in the direction substantially perpendicular to the surface of the component and thereby improve heat conduction through the TIM pad. As noted above, the thermal conductivity of the TIM pad is greater in a direction substantially perpendicular to the surface of the component than in a direction substantially parallel to the surface of the component.

In one embodiment, the graphene layers may form approximately 9% of the total volume of the TIM pad such that the thermal conductivity of the TIM pad can be increased as calculated above.

In block 408, the TIM pad is compressed between the frame and the component. The compression may occur as a result of fixing one portion of the frame to another portion of the frame. For example, the TIM pad may be compressed by fixing a top portion of the frame to a bottom portion of the frame upon which the component is mounted. The compression may also occur by fixing the frame to a PCB as shown in FIG. 2. The process of FIG. 4 then ends in block 410.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive.

What is claimed is:

1. A thermal interface material (TIM) pad for dissipating heat from a component in an electronic device, the TIM pad comprising:
   a plurality of TIM layers; and
   at least one graphene layer interposed between the plurality of TIM layers, wherein the at least one graphene layer extends in a direction substantially perpendicular to a major surface of the TIM pad that is configured to contact the component, and wherein the at least one graphene layer extends to the major surface of the TIM pad.

2. The TIM pad of claim 1, wherein:
   the major surface of the TIM pad contacts a surface of the component; and
   the at least one graphene layer extends in a direction substantially perpendicular to the surface of the component, such that the thermal conductivity of the TIM pad is greater in the direction substantially perpendicular to the surface of the component than in a direction substantially parallel to the surface of the component.

3. The TIM pad of claim 1, wherein the at least one graphene layer forms between 5% and 15% of the total volume of the TIM pad.

4. The TIM pad of claim 1, wherein:
   the electronic device comprises a data storage device; and
   the TIM pad forms a portion of the data storage device.

5. The TIM pad of claim 4, wherein the component includes at least one of a system on a chip (SOC), a flash memory, or a double data rate synchronous dynamic random-access memory (DDR SDRAM).

6. The TIM pad of claim 1, wherein the major surface of the TIM pad contacts a grounded heat spreader plate of the component.

7. The TIM pad of claim 1, wherein the major surface of the TIM pad contacts a surface of the component and the plurality of TIM layers are flexible, so that an outer TIM layer of the plurality of TIM layers deforms outward in a direction substantially parallel to the surface of the component when compressed against the surface of the component.

8. The TIM pad of claim 1, wherein the TIM pad is compressed between the component and a frame housing the component.

9. A method for dissipating heat from a component of an electronic device, the method comprising:
   forming a thermal interface material (TIM) pad by at least:
      stacking a plurality of TIM layers with at least one graphene layer interposed between the plurality of TIM layers to reach a length for the TIM pad; and
      cutting the stacked layers corresponding to a thickness for the TIM pad for compression against the component, wherein the at least one graphene layer extends in a direction substantially perpendicular to a major surface of the TIM pad that is configured to contact the component, and wherein the at least one graphene layer extends to the major surface of the TIM pad.

10. The method of claim 9, further comprising:
    placing the major surface of the TIM pad adjacent the component such that the major surface of the TIM pad contacts a surface of the component,
    wherein the at least one graphene layer extends in a direction substantially perpendicular to the surface of the component, such that the thermal conductivity of the TIM pad is greater in the direction substantially perpendicular to the surface of the component than in a direction substantially parallel to the surface of the component.

11. The method of claim 9, wherein the at least one graphene layer forms between 5% and 15% of the total volume of the TIM pad.

12. The method of claim 9, wherein the plurality of TIM layers include an adhesive property that allow for the plurality of TIM layers to adhere to the at least one graphene layer.

13. The method of claim 9, wherein the at least one graphene layer is approximately 0.1 mm thick.

14. The method of claim 9, wherein cutting the stacked layers includes cutting the stacked layers with a laser cutter, saw or razor.

15. The method of claim 9, wherein the stacked layers are cut to a thickness greater than a space to be filled by the TIM pad.

16. The method of claim 9, further comprising:
    removing the TIM pad from the stacked layers;
    placing the major surface of the TIM pad adjacent the component or a frame of the electronic device; and
    compressing the TIM pad between the frame and the component.

17. The method of claim 16, wherein compressing the TIM pad includes fixing a first portion of the frame to a second portion of the frame.

18. The method of claim 16, wherein compressing the TIM pad includes fixing the frame to a printed circuit board (PCB) of the electronic device.

19. The method of claim 16, wherein:
    the electronic device comprises a data storage device; and
    the TIM pad, the frame and the component form a portion of the data storage device.

20. A data storage device comprising:
    a component that generates heat; and
    a thermal interface material (TIM) pad for dissipating heat from the component, the TIM pad comprising:
       a plurality of TIM layers; and
       at least one graphene layer interposed between the plurality of TIM layers,
    wherein the at least one graphene layer extends in a direction substantially perpendicular to a major surface of the TIM pad that is configured to contact the component, and
    wherein the at least one graphene layer extends to the major surface of the TIM pad.

21. The data storage device of claim 20, wherein the component includes at least one of a system on a chip (SOC), a flash memory, or a double data rate synchronous dynamic random-access memory (DDR SDRAM).

22. The data storage device of claim 20, wherein the major surface of the TIM pad contacts a grounded heat spreader plate of the component.

23. The data storage device of claim 20, wherein the major surface of the TIM pad contacts a surface of the component and the plurality of TIM layers are flexible, so that an outer TIM layer of the plurality of TIM layers deforms outward in a direction substantially parallel to the surface of the component when compressed against the surface of the component.

24. The data storage device of claim 20, further comprising a frame housing the component, wherein the TIM pad is compressed between the component and the frame.

\* \* \* \* \*